(12) United States Patent
Tsukao

(10) Patent No.: US 12,590,194 B2
(45) Date of Patent: Mar. 31, 2026

(54) ANISOTROPIC CONDUCTIVE FILM

(71) Applicant: DEXERIALS CORPORATION,
Shimotsuke (JP)

(72) Inventor: Reiji Tsukao, Utsunomiya (JP)

(73) Assignee: DEXERIALS CORPORATION,
Shimotsuke (JP)

( * ) Notice: Subject to any disclaimer, the term of this
patent is extended or adjusted under 35
U.S.C. 154(b) by 759 days.

(21) Appl. No.: 17/798,361

(22) PCT Filed: Feb. 6, 2021

(86) PCT No.: PCT/JP2021/004472
§ 371 (c)(1),
(2) Date: Sep. 12, 2022

(87) PCT Pub. No.: WO2021/161935
PCT Pub. Date: Aug. 19, 2021

(65) Prior Publication Data
US 2023/0118485 A1 Apr. 20, 2023

(30) Foreign Application Priority Data

Feb. 12, 2020 (JP) ................................. 2020-021964
Feb. 6, 2021 (JP) ................................. 2021-017870

(51) Int. Cl.
*H01L 23/00* (2006.01)
*C08J 5/18* (2006.01)
*C08K 11/00* (2006.01)

(52) U.S. Cl.
CPC ............... *H01L 24/29* (2013.01); *C08J 5/18*
(2013.01); *C08K 11/00* (2013.01); *H01L 24/32*
(2013.01);
(Continued)

(58) Field of Classification Search
CPC ......... H01L 24/29; H01L 24/32; H01L 24/83;
H01L 2224/2929; H01L 2224/29339;
(Continued)

(56) References Cited

U.S. PATENT DOCUMENTS 8,148,641 B2* 4/2012 Tanaka ................... H05K 3/323
174/250
2021/0305195 A1* 9/2021 Tsukao .................... H01L 24/29

FOREIGN PATENT DOCUMENTS

CN 101897083 A 11/2010
CN 109074894 A 12/2018
(Continued)

OTHER PUBLICATIONS

Mar. 22, 2024 Korean Office Action issued in Korean Patent
Application No. 10-2022-7026297.
(Continued)

*Primary Examiner* — Travis M Figg
(74) *Attorney, Agent, or Firm* — OLIFF PLC

(57) ABSTRACT

An anisotropic conductive film includes conductive particles
disposed in an insulating resin layer. Zigzag arrangements
are arranged at a predetermined pitch in an x direction on an
xy plane in a plan view of the anisotropic conductive film
with positions thereof in a y direction being periodically
altered. The zigzag arrangements each include an arrange-
ment Rb and an arrangement Rc repeatedly provided at
predetermined intervals in the y direction. The arrangement
Rb includes the conductive particles arranged at a positive
inclination, and the arrangement Rc includes the conductive
particles arranged at a negative inclination. This configura-
tion can form a pseudo random regular disposition.

26 Claims, 19 Drawing Sheets y DIRECTION x DIRECTION

(52) U.S. Cl.
CPC ........... *H01L 24/83* (2013.01); *C08J 2300/12* (2013.01); *C08K 2201/001* (2013.01); *H01L 2224/2929* (2013.01); *H01L 2224/29339* (2013.01); *H01L 2224/29344* (2013.01); *H01L 2224/29355* (2013.01); *H01L 2224/29357* (2013.01); *H01L 2224/29364* (2013.01); *H01L 2224/32225* (2013.01); *H01L 2224/83851* (2013.01)

(58) Field of Classification Search
CPC . H01L 2224/29344; H01L 2224/29355; H01L 2224/29357; H01L 2224/29364; H01L 2224/32225; H01L 2224/83851; C08J 5/18; C08J 2300/12; C08K 11/00; C08K 2201/001

See application file for complete search history.

(56) References Cited

FOREIGN PATENT DOCUMENTS

| | | | | | |
|---|---|---|---|---|---|
| CN | 109075471 | A | | 12/2018 | |
| CN | 109843992 | A | * | 6/2019 | ............. H01L 24/27 |
| DE | 60018873 | T2 | * | 2/2006 | ............. H01L 24/29 |
| JP | H09-320345 | A | | 12/1997 | |
| JP | 2001189171 | A | * | 7/2001 | |
| JP | 200585634 | A | | 3/2005 | |
| JP | 2015-232660 | A | | 12/2015 | |
| JP | 2016225295 | A | * | 12/2016 | ............. H01R 11/01 |
| JP | 6187665 | B1 | | 8/2017 | |
| JP | 2017-168465 | A | | 9/2017 | |
| JP | 2017-204462 | A | | 11/2017 | |
| JP | 2017-204463 | A | | 11/2017 | |
| JP | 2019-031649 | A | | 2/2019 | |
| JP | 2020027798 | A | * | 2/2020 | ............. H05K 3/323 |
| KR | 20090005007 | A | * | 1/2009 | ............. H01R 11/01 |
| WO | WO-2016067828 | A1 | * | 5/2016 | ............... H01B 5/16 |
| WO | WO-2017191781 | A1 | * | 11/2017 | ............... H01B 1/20 |

OTHER PUBLICATIONS

Dec. 24, 2024 Office Action issued in Japanese Patent Application No. 2021-017870.
Apr. 13, 2021 International Search Report issued in International Patent Application No. PCT/JP2021/004472.
Apr. 13, 2021 Written Opinion issued in International Patent Application No. PCT/JP2021/004472.
Jan. 28, 2022 International Preliminary Report on Patentability issued in International Patent Application No. PCT/JP2021/004472.
May 7, 2024 Office Action issued in Taiwanese Patent Application No. 110104752.
Oct. 16, 2024 Office Action issued in Chinese Patent Application No. 202180012654.4.

* cited by examiner y DIRECTION x DIRECTION

R1    R2    R3    R4    R5    R6

Ld2

L0y

L3(L3₂)

−α

Rc

L2

Ru

L3(L3₁)

Ld1

Rb

F0

L1

α

Ly

U

2

F

Lx pa

L0x y DIRECTION x DIRECTION

1A y DIRECTION x DIRECTION

10A

10B

10C y DIRECTION x DIRECTION y DIRECTION x DIRECTION y DIRECTION x DIRECTION y DIRECTION x DIRECTION y DIRECTION x DIRECTION

R1  R2  R3  R4

Le

2

Rc2

Rb2

Le

L3

L2  Rc1  α

L3  Ld

L1  Ly  Rb1  α pa

U y DIRECTION                                        1E x DIRECTION y DIRECTION x DIRECTION

1B₁ y DIRECTION x DIRECTION

1X

ANISOTROPIC CONDUCTIVE FILM

TECHNICAL FIELD

The present invention relates to an anisotropic conductive film.

BACKGROUND ART

As lighter weight and flexibility are desired for substrates for electronic parts such as IC chips to be mounted on, plastic substrates and FPCs (Flexible Printed Circuits) are frequently used. The terminals of electronic parts such as IC chips are becoming finer in pitch, and the thermal expansion of plastic substrates and FPCs can be problematic in mounting the electronic parts. To ensure reliable connection of electronic parts despite displacement of the terminals due to temperature variations when mounting the electronic parts, the terminals constituting the terminal arrays of the electronic parts are sometimes aligned in a radial pattern (so-called fan-out wiring) instead of being conventionally aligned in the same direction (Patent Literature 1).

Aside from the fan-out arrangement, unconventional unique electrode arrangements are also desired for LED elements (so-called micro LEDs or mini LEDs) and the like.

Anisotropic conductive films including an insulating resin layer in which conductive particles are dispersed are widely used in mounting electronic parts. In connecting electronic parts using an anisotropic conductive film, it has been proposed that the conductive particles in the anisotropic conductive film be disposed in a lattice form such as a hexagonal lattice with the arrangement axis inclined with respect to the long-side direction of the terminals so that conductive particles in the anisotropic conductive film are captured stably by the terminals of the electronic parts even if the terminals of the electronic parts have finer pitches (Patent Literature 2). It has also been proposed as a particle disposition of an anisotropic conductive film that conductive particles be arranged in a first direction inclined with respect to a long-side direction of the film, and a plurality of such particle arrangements in the first direction be aligned in a second direction different from the arrangement direction of the particle arrangements so that the particle arrangements in the first direction have a width of less than 2.5 times the particle diameter of the conductive particles instead of being in a straight line (Patent Literature 3). It has also been proposed to repeatedly dispose units in which conductive particles are arranged at predetermined intervals (Patent Literature 4 and Patent Literature 5).

CITATION LIST

Patent Literature

Patent Literature 1: Japanese Patent Application Laid-Open No. 2015-232660

Patent Literature 2: Japanese Patent Application Laid-Open No. Hei. 9-320345

Patent Literature 3: Japanese Patent Application Laid-Open No. 2017-168465

Patent Literature 4: Japanese Patent Application Laid-Open No. 2017-204462

Patent Literature 5: Japanese Patent Application Laid-Open No. 2017-204463

SUMMARY OF INVENTION

Technical Problem

Suppose, for example, that an anisotropic conductive film is used for FOG (Film On Glass) connection. As shown in FIG. 11A, suppose also that terminals 20 to be connected are aligned in the same direction, conductive particles 2 of the anisotropic conductive film are disposed in a hexagonal lattice, and the arrangement axis is inclined at an angle of $\delta$ with respect to the long-side direction of the terminals 20 (direction perpendicular to the arrangement direction x). Even in such a case, thermal pressure-bonding for connection causes a resin flow in the direction of the arrow between the terminals. Depending on the condition, dense regions A where conductive particles 2 are dense can thus occur between the terminals as shown in FIG. 11B to develop a short circuit.

As shown in FIG. 12A, suppose that a terminal array with a fan-out pattern is connected using an anisotropic conductive film where conductive particles 2 are disposed in a hexagonal lattice, with the arrangement axis of the hexagonal lattice inclined with respect to the long-side direction of the film (inclination angle $\gamma$). Since the fan-out angle $\beta$, (i.e., the angle of the long-side direction of the terminals 20 with respect to the arrangement direction x of the terminals) varies slightly from one terminal to another throughout the terminal array, the number of conductive particles 2 captured by one terminal and the distribution state of the conductive particles 2 differ between the right and left sides of the terminal array of the fan-out pattern. The indentations after the connection also appear different. Moreover, in the disposition of the conductive particles shown in the diagram, where the terminal array is in a temporarily bonded state before thermal pressure-bonding, a terminal 20a shown to the left only captures conductive particles 2 at its edges. This can cause poor conduction after the connection.

If a terminal array is connected using an anisotropic conductive film where conductive particles are disposed in a hexagonal lattice, the number of arrangement axes which are perpendicular to the arrangement direction x of the terminals and which are involved in capturing particles varies from one terminal to another. The number of conductive particles captured by one terminal varies greatly, and the distribution of the numbers of captured conductive particles can be bimodal. This is not limited to a hexagonal lattice, and can also occur with square and oblique lattices. For example, as shown in FIG. 12B, conductive particles 2 captured by a terminal 20b belong to one arrangement axis y1 perpendicular to the arrangement direction x of the terminals. By contrast, a terminal 20c captures conductive particles 2 which belong to two arrangement axes y2 and y3. As shown in FIG. 12C, such a phenomenon is more significant with a terminal array where the axes of the respective terminals are in the same direction than with a terminal array of a fan-out pattern. There are considerable numbers of terminals 20b where one arrangement axis y1 is involved in connection and terminals 20c where two arrangement axes y2 and y3 are involved in connection, and the number of conductive particles captured by one terminal varies greatly. A graph plotting the number of conductive particles captured by a terminal and the frequency of terminals capturing the same number of conductive particles can thus have a plurality of peaks. Specifically, for example, two peaks can occur due to multiple factors including the terminal width, the inter-terminal spacing, the particle diameter, and the inter-particle distances. Bimodal distributions are not necessarily problematic in practical use, however unimodal distributions are easier to control the number of conductive particles captured.

Thermal pressure-bonding for connection increases the distances between the conductive particles on the terminals more in the short-side direction of the terminals than in the long-side direction. Conductive particles are pushed off the terminals to between the terminals, and the conductive particles lying between the terminals, including those pushed off, are moved by resin flow during the thermal pressure-bonding. Therefore, the distribution of conductive particles with respect to a terminal differs between the right and left sides of the terminal array. If there are formed regions where conductive particles are dense between terminals, there will arise a problem of easily developing a short circuit in such regions.

The phenomenon in which conductive particles between terminals develop a short circuit due to resin flow during thermal pressure-bonding also occurs when the terminal array has a radial fan-out pattern and when straight terminals are straightly aligned in the same direction (straight parallel arrangement). In view of this, a photocurable resin can be used for the insulating resin layer of the anisotropic conductive film to reduce the movement of the conductive particles due to resin flow. However, if the photocurable resin is used to suppress the movement of the conductive particles due to resin flow by creating a condition in which photocured resin also exists in the resin layer to be cured for connection, the conductive particles are likely to be insufficiently pressed during thermal pressure-bonding and the connection between the terminals and the conductive particles can be poor. As described in Japanese Patent No. 6187665, it can be conceived that the melt viscosity of the insulating resin layer can be increased by adding a filler to the insulating resin layer or by other treatments so that resin flow is reduced while sufficient pressure is applied during thermal pressure-bonding. However, a further reduction in short circuits has been demanded for terminal arrays of straight parallel arrangement and terminal arrays of fan-out pattern as well. The reason is that it is difficult to completely avoid a short circuit between conductive particles by using only the curability and viscosity of the insulating resin layer holding the conductive particles. In particular, there is a certain possibility that the occurrence of a short circuit can be unavoidable in the event of irregular resin flow or misalignment when continuously producing a number of connection structures on a production line and the like in charge of the connection process. As the terminal layouts and the materials of the electronic parts are diversified, conduction and short-circuit prevention are even more difficult to achieve in a compatible manner for a given terminal layout and given materials of electronic parts.

To stabilize the number of conductive particles captured by each terminal and prevent a short circuit due to resin flow, a first particle arrangement of conductive particles may be configured not to be straight but have a width greater than or equal to the particle diameter as described in Patent Literature 3. This, however, makes the number of conductive particles captured by each terminal difficult to control within a predetermined range since the particle disposition is not exactly controllable. The number of captured conductive particles is even more difficult to control within a predetermined range in the event of irregular resin flow or misalignment on the production line and the like when continuously producing connection structures. The greater the number of connection structures to be continuously produced, the more difficult the control.

Even if conductive particle units are repeatedly disposed as described in Patent Literature 4 and Patent Literature 5, the distribution of conductive particles is difficult to make the right and left sides of the terminal array of the fan-out side pattern equivalent to each other. The shorter the terminal length, the more difficult. Variations in the number of conductive particles captured by each terminal are thus difficult to reduce.

In view of the above-mentioned problems, an object of the present invention is to uniformize the capturing condition of conductive particles by the connected terminals observable from indentations and the like, provide a favorable conductive condition in which each terminal holds a sufficient amount of conductive particles, and enable prevention of a short circuit even in connecting fine-pitched terminals regardless of whether the axes of the respective terminals in the terminal array to be connected are aligned in the same direction and the terminal array is straight, whether the terminal array has a radial fan-out pattern, or what the materials of the electronic parts are.

Solution to Problem

The present inventor has conceived that conductive particles in an anisotropic conductive film can be disposed in a pseudo random regular disposition by arranging zigzag arrangements R of conductive particles extending in a y direction on an xy plane at a predetermined pitch in an x direction while periodically altering the positions thereof in the y direction and the above-mentioned problems can thereby be solved, and completed the present invention.

More specifically, the present invention provides an anisotropic conductive film including conductive particles disposed in an insulating resin layer, wherein zigzag arrangements R are arranged at a predetermined pitch in an x direction on an xy plane in a plan view of the anisotropic conductive film with positions thereof in a y direction being periodically altered, the zigzag arrangements R each includes an arrangement Rb and an arrangement Rc repeatedly provided at predetermined intervals in the y direction, the arrangement Rb includes the conductive particles arranged at a positive inclination, and the arrangement Rc includes the conductive particles arranged at a negative inclination.

The present invention also provides a producing method of a connection structure that connects a terminal of a first electronic part and a terminal of a second electronic part by anisotropic conductive connection using the aforementioned anisotropic conductive film.

The present invention further provides a connection structure including a first electronic part and a second electronic part connected by anisotropic conductive connection via the above-mentioned anisotropic conductive film.

In the present invention, an anisotropic conductive film refers to a film that can form anisotropic conductive connection. An anisotropic conductive connection state refers to a state where opposed terminals of electronic parts each including a plurality of terminals are electrically connected to each other and adjoining terminals are not electrically connected to each other.

Advantageous Effects of Invention

The anisotropic conductive film according to the present invention includes a pseudo random regular disposition of conductive particles in a plan view. As employed herein, the pseudo random regular disposition refers to a disposition that looks like a uniform disposition where conductive particles are disposed at random without regularity or reproducibility but actually is reproducible and systematic. According to the anisotropic conductive film of the present invention, the conductive particles are disposed in the pseudo random regular disposition and distributed so uniformly that unevenness is not observable even under microscopic observation. Sufficient conductive particles can thus be uniformly captured to obtain a favorable conductive state regardless of whether the axes of the respective terminals constituting the terminal arrays to be connected are aligned in the same direction and the terminal arrays are straight, whether the terminal arrays have a radial fan-out pattern, whether the terminals are laterally long, or whether the terminals are deformed wiring bumps.

The anisotropic conductive film can also provide a favorable conductive state regardless of the direction in which the anisotropic conductive film is bonded to the terminals.

Moreover, the uniform distribution of the conductive particles can prevent the occurrence of a short circuit even in connecting fine-pitched terminals.

In addition, since the pseudo random regular disposition has a predetermined periodicity, whether or not the conductive particles are disposed in the predetermined pseudo random regular disposition can be easily inspected in the product inspection of the anisotropic conductive film.

BRIEF DESCRIPTION OF DRAWINGS

FIG. 1A-2 is an enlarged view of FIG. 1A-1.

FIG. 2 is a cross-sectional view of the anisotropic conductive film 10A according to the embodiment.

DESCRIPTION OF EMBODIMENTS

Figures 1, 1A:
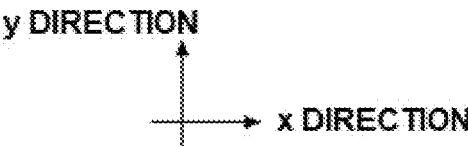
FIG. 1A-1 shows a pseudo random regular disposition 1A of conductive particles included in an anisotropic conductive film 10A according to an embodiment.

An anisotropic conductive film according to an embodiment of the present invention will be described in detail below with reference to the drawings. In the drawings, the same reference numerals represent the same or similar components.

<Overall Configuration of Anisotropic Conductive Film>

Figures 1, 1A, 2:

FIG. 1A-1 is a plan view showing a disposition of conductive particles of an anisotropic conductive film 10A according to the embodiment, and shows a pseudo random regular disposition 1A of this anisotropic conductive film. FIG. 1A-2 is an enlarged view of FIG. 1A-1. FIG. 2 is a cross-sectional view of the anisotropic conductive film 10A taken in a thickness direction.

Figure 3A:
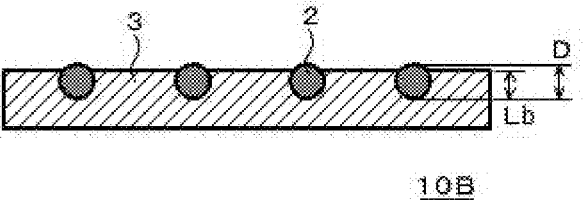
FIG. 3A is a cross-sectional view of an anisotropic conductive film 10B according to the embodiment.

The anisotropic conductive film 10A has a layer configuration in which conductive particles 2 are disposed in a single layer on or near the surface of an insulating resin layer 3 and a low-viscosity resin layer 4 is formed thereon. In the present invention, the low-viscosity resin layer 4 is provided according to necessity. Like a cross-sectional view of an anisotropic conductive film 10B shown in FIG. 3A, a layer configuration in which the low-viscosity resin layer 4 is omitted may be employed. The planar disposition of the conductive particles 2 in the anisotropic conductive film 10B can be the same as with the anisotropic conductive film 10A including the low-viscosity resin layer 4. Like an anisotropic conductive film 10C shown in FIG. 3B, the anisotropic conductive film may have a layer configuration in which conductive particles 2 are held by through holes 3h in an insulating film 3 and low-viscosity resin layers 4A and 4B are formed on the top and bottom surfaces thereof. In such a case, the insulating film 3 is formed of a resin layer less prone to deformation by heat and pressure than the low-viscosity resin layers 4A and 4B.

<Conductive Particles>

Particle Material:

Examples of the conductive particles 2 include metal particles such as nickel, cobalt, silver, copper, gold and palladium particles, alloy particles such as solder particles, and metal-coated resin particles. Two or more types of particles can be used in combination. Of these, metal-coated resin particles are preferable since connected resin particles repel each other to facilitate sustained contact with terminals for stable conduction performance. Insulating treatment which does not interfere with the conductive properties may be applied to the surfaces of the conductive particles. For example, insulating fine particles may be attached by conventional techniques. The conductive particles may be insulation-coated with an insulating resin.

Particle Diameter:

The particle diameter of the conductive particles 2 is selected as appropriate depending on the purpose of use. To reduce an increase in conduction resistance and prevent the occurrence of a short circuit, the particle diameter is usually preferably 1 μm or more and not more than 30 μm. For fine-pitch applications, the particle diameter may preferably be 2 μm or more and less than 10 μm. For even finer pitches, the particle diameter can be less than 2 μm. The particle diameter of the conductive particles before dispersion into the insulating resin layer can be measured using an ordinary particle size distribution measuring instrument. An average particle diameter can also be determined using a particle size distribution measuring instrument. An example of the measuring instrument is an image-type FPIA-3000 (Malvern Panalytical Ltd). In such a case, it is desirable for the number of samples for measuring the conductive particle diameter to be 1000 or more, preferably 2000 or more. The particle diameter of the conductive particles in the anisotropic conductive film can be determined using an electron microscope such as a SEM. In such a case, it is desirable for the number of samples for measuring the conductive particle diameter to be 200 or more, preferably 1000 or more.

As for variations in the particle diameter, the CV value (coefficient of variation=standard deviation/average) of the particle diameter is preferably 20% or less. Smaller variations in the particle diameter can provide wider margins for heating and pressure conditions during thermal pressure-bonding.

An aggregation of fine particles can be regarded as a disposition of a single conductive particle. In such a case, the diameter of the aggregation should satisfy the CV value of 20% or less.

If conductive particles given the above-mentioned insulating treatment at the surface are used, the particle diameter of the conductive particles according to the present invention refers to that without the insulating-treatment portions.

<Planar Disposition of Conductive Particles>

Figure 1B:
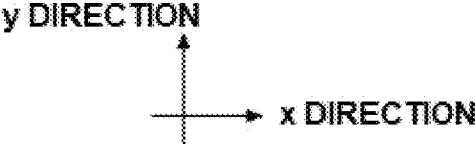
FIG. 1B is an explanatory diagram of a creation method of the pseudo random regular disposition 1A of conductive particles included in the anisotropic conductive film 10A according to the embodiment.
Figure 2:
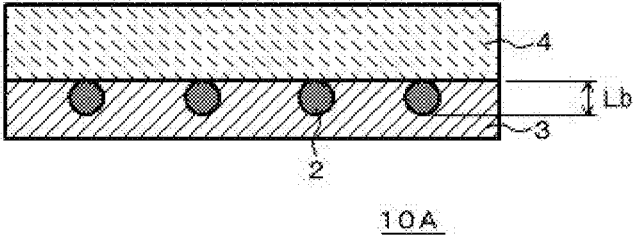

FIG. 1A-1 shows the pseudo random regular disposition 1A of conductive particles 2 included in the anisotropic conductive film 10A. FIG. 1B is an explanatory diagram of a creation method of the pseudo random regular disposition 1A, showing a state before the positions of zigzag arrangements R in a y direction are periodically altered.

This pseudo random regular disposition 1A can be created in the following manner. Firstly, a zigzag arrangement R is assumed (FIG. 1B) where an arrangement Rb including conductive particles 2 arranged at a positive inclination and an arrangement Rc including conductive particles 2 arranged at a negative inclination are repeatedly provided at predetermined intervals in the y direction on the xy plane. Next, such zigzag arrangements R are arranged at a predetermined pitch in the x direction while periodically altering the positions thereof in the y direction (FIG. 1A-1). In such a case, a conductive particle pattern where zigzag arrangements R are arranged at a predetermined pitch in the x direction in advance may be assumed, and the positions of the zigzag arrangements R constituting the conductive particle pattern in the y direction can be periodically altered.

More specifically, for example, to create the pseudo random regular disposition 1A shown in FIG. 1A-1, an arrangement Rb including three conductive particles 2 arranged at an angle α with respect to the x direction and an arrangement Rc including three conductive particles arranged in a direction reverse to the arrangement direction with respect to the x direction are initially assumed. The arrangement direction of the conductive particles in this arrangement Rc forms an angle of $-\alpha$ with respect to the x direction (FIG. 1B). A pitch L1 of the conductive particles in the arrangement Rb in the y direction and a pitch L2 of the conductive particles in the arrangement Rc in the y direction may be the same or different.

Next, assume a zigzag arrangement R where the arrangements Rb and Rc are repeatedly disposed at predetermined intervals $L3_1$ and $L3_2$ in the y direction (FIG. 1B). In the present invention, the zigzag arrangement R does not necessarily need to include the arrangements Rb and Rc arranged alternately, as long as the arrangements Rb and Rc are repeatedly arranged. In the present embodiment, the arrangements Rb and Rc are alternately arranged.

In a zigzag arrangement R, the amount of deviation Ld1 and Ld2 (FIG. 1B) between the closest conductive particles of adjoining arrangements Rb and Rc in the x direction can be set as appropriate. In the present embodiment, the amount of deviation in the x direction between the arrangements Rb repeatedly provided in the y direction and the amount of deviation between arrangements Rc in the x direction are zero, and thus Ld1=Ld2=Ld.

Next, assume the zigzag arrangements R arranged at a predetermined pitch pa in the x direction (FIG. 1B). Here, the positions of the zigzag arrangements R in the y direction are altered periodically (one cycle: R1, R2, R3, R4, R5, and R6) as shown by a double-dotted dashed polygonal line F in FIG. 1A-1, whereby the pseudo random regular disposition 1A is obtained.

In the present embodiment, the number of conductive particles constituting an arrangement Rb and the number of conductive particles constituting an arrangement Rc are not particularly limited. For convenience of design of the particle disposition, the arrangement Rb is formed of preferably two to ten conductive particles, more preferably two to six, still further preferably two to four, and particularly two to three. The arrangement Rc is also formed of preferably two to ten conductive particles, more preferably two to six, still further preferably two to four, and particularly two to three.

In the present embodiment, the angle formed between the arrangement Rb and the x direction is α, and the angle formed between the arrangement Rc and the x direction is $-\alpha$. The arrangement direction of the arrangement Rb and that of the arrangement Rc are thus symmetric about the x-axis. In the present invention, it is not necessary for the angle formed between the arrangement Rb and the x direction and the angle formed between the arrangement Rc and the x direction to have identical absolute value. For convenience of design, the ratio of a difference between the absolute value of the angle formed between the arrangement Rb and the x direction and the absolute value of the angle formed between the arrangement Rc and the x direction to the absolute value of the angle formed between the arrangement Rb and the x direction is preferably 20% or less. This facilitates the creation of a pseudo random regular disposition where conductive particles are uniformly distributed without overlap. Depending on settings such as the pitch L1, the pitch L2, the pitch pa, and the intervals L3, a pseudo random regular disposition where conductive particles are uniformly distributed can be created even if the foregoing ratio exceeds 20%. To ensure irregular appearance, the absolute value of the angle $\alpha$ is preferably 5° to 85°, more preferably 10° to 80°, and still further preferably 15° to 75°.

In the present embodiment, when the zigzag arrangements R arranged in the x direction are located at constant positions in the y direction (FIG. 1B), the pitch pa of the zigzag arrangements R in the x direction is constant. However, in the present invention, the pitch pa does not necessarily need to be constant if systematic. For example, a pitch pa1 and a pitch pa2 may appear at predetermined cycles. However, for convenience of design of the pseudo random regular disposition, when the zigzag arrangements R arranged in the x direction are located at constant positions in the y direction, the pitch pa of the zigzag arrangements R in the x direction is preferably constant as shown in FIG. 1B.

In the present invention, pa>Lx is preferably satisfied, where Lx is the amplitude in the x direction of the polygonal line which forms a minimum repetition unit Ru (FIG. 1A-2) of the zigzag arrangements R including adjoining arrangements Rb and Rc. This can prevent conductive particles from overlapping each other even if the positions of the zigzag arrangements R in the y direction are periodically altered in creating the pseudo random regular disposition. On the other hand, pa≤Lx may be implemented in the case of closely disposing conductive particles in the x direction, for example.

The pitch L1 of the conductive particles of the arrangement Rb in the y direction, the pitch L2 of the conductive particles of the arrangements Rc in the y direction, and the pitch pa of the zigzag arrangements R in the x direction when the zigzag arrangements R are located at constant positions in the y direction as shown in FIG. 1B may be different from each other. In view of uniform dispersion of the conductive particles and easy design of the pseudo random regular disposition, it is desirable that these pitches are substantially the same. As employed herein, a fact that these pitches are substantially the same means that the eventually obtained pseudo random regular disposition has substantially the same irregularity and uniformity.

As for the intervals L3 in the y direction when the arrangements Rb and Rc are alternately arranged in the y direction, a pseudo random regular disposition can be formed regardless of whether the interval $L3_1$ with an arrangement Rc above an arrangement Rb and the interval $L3_2$ with an arrangement Rb above an arrangement Rc are the same or different. In view of uniform dispersion of the conductive particles and easy design of the pseudo random regular disposition, these intervals $L3_1$ and $L3_2$ are also preferably systematic. In particular, the intervals are more preferably constant and the same. The intervals $L3_1$ and $L3_2$ and the foregoing pitches L1, L2, and pa may be the same or different. In view of easy design, it is more preferable that the intervals $L3_1$ and $L3_2$ are constant and the same, and the intervals L3 ($L3_1$ and $L3_2$) and the foregoing pitches L1, L2, and pa are the same.

In periodically altering the positions of the zigzag arrangements R in the y direction, the periodic alterations are not limited to any particular pattern. However, it is desirable for the positions of the zigzag arrangements R in the y direction to be altered along a polygonal line F0 (FIG. 1A-2), where the polygonal line F0 is configured to be symmetric, about y=x, to the polygonal line forming the minimum repetition unit Ru of the zigzag arrangements R including adjoining arrangements Rb and Rc and corresponds to one cycle of the zigzag arrangements R in the x direction. The disposition of the conductive particles in the repetition unit of the pseudo random regular disposition can thereby be made closer to be symmetric about y=x, whereby the uniformity of the disposition of the conductive particles can be improved. As will be described below, the periodic polygonal line extending in the x-axis direction in periodically altering the positions of the zigzag arrangements R in the y direction is not limited to F. When a polygonal line symmetric to the polygonal line forming the minimum repetition unit Ru of the zigzag arrangements R or a polygonal line obtained by modifying the same is used as the repetition unit of the periodic polygonal line extending in the x-axis direction, the axis of symmetry may be y≠x.

It is desirable for Ly<L3 ($L3_1$, $L3_2$) to be satisfied, where Ly is the amplitude of the polygonal line F in the y direction. The minimum repetition unit Ru of the pseudo random regular disposition can thereby be configured as a conductive particle pattern included in a rectangle U having a length L0x in the x direction and a length L0y in the y direction (pattern with dark-shaded conductive particles in FIGS. 1A-1 and 1A-2), where L0x is equivalent to one cycle of the zigzag arrangements R, and L0y is the length of the minimum repetition unit Ru in the y direction of the zigzag arrangements R in the y direction. If an anisotropic conductive film having the pseudo random regular disposition is produced, this facilitates an inspection as to whether the conductive particles in the film are disposed in the pseudo random regular disposition. In particular, it is desirable for the number of conductive particles in the minimum repetition unit Ru of the zigzag arrangements R including adjoining arrangements Rb and Rc and the number of arrangements in one cycle of the zigzag arrangements R in the x direction to be the same. In such a case, with the pitch L1=the pitch L2=the intervals L3=the pitch pa, the conductive particle pattern serving as the minimum repetition unit of the pseudo random regular disposition can be configured as a pattern symmetric about y=x. This is desirable because the inspection as to whether the conductive particles in the anisotropic conductive film are disposed in the pseudo random regular disposition is facilitated.

(Modifications of Pseudo Random Regular Disposition)

Figure 4A:
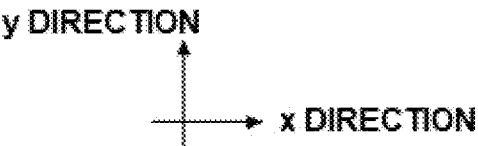
FIG. 4A shows a pseudo random regular disposition 1B of conductive particles included in an anisotropic conductive film according to the embodiment.

FIG. 4A shows a pseudo random regular disposition 1B, where the arrangements Rb and Rc include two conductive particles each, the pitch L1=the pitch L2=the intervals L3=the pitch pa, the amount of deviation Ld/the pitch pa=0.25, and the angle $\alpha$=60°.

Figure 4B:
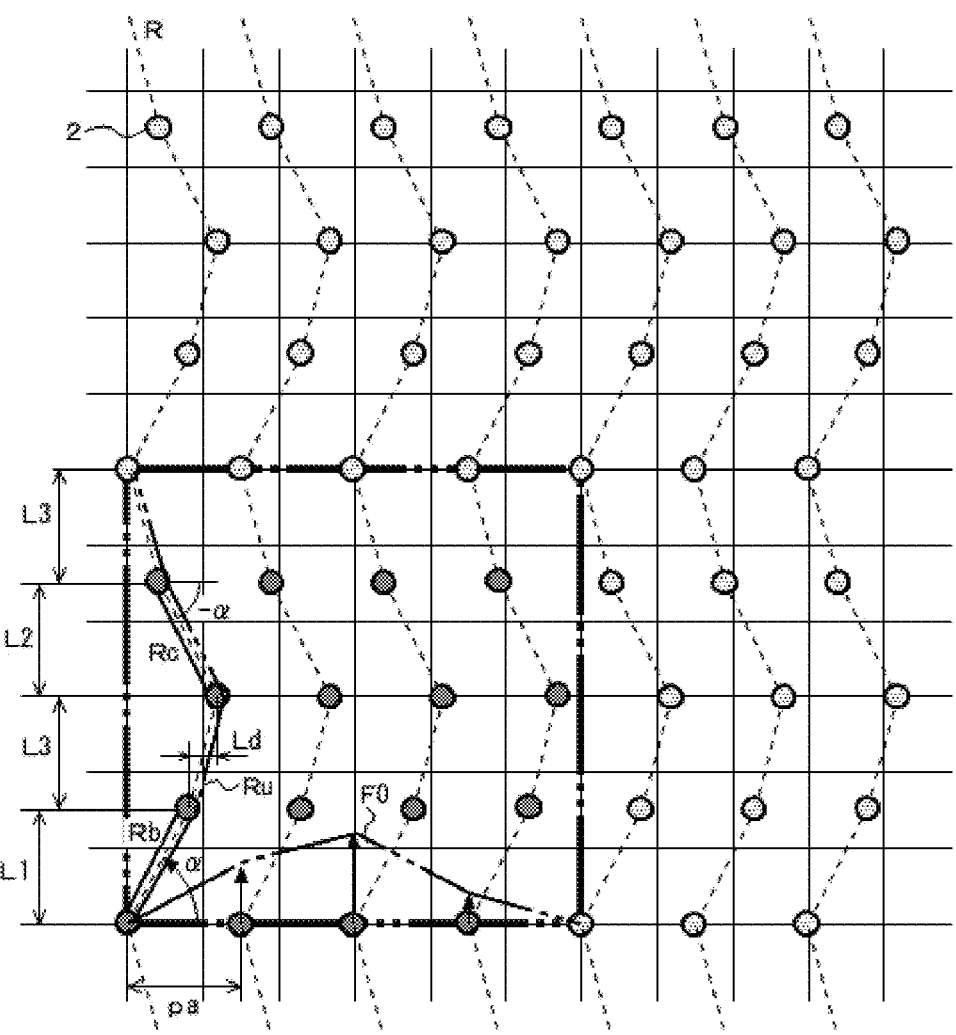
FIG. 4B is an explanatory diagram of a creation method of the pseudo random regular disposition 1B of conductive particles included in the anisotropic conductive film according to the embodiment.
Figure 4B:
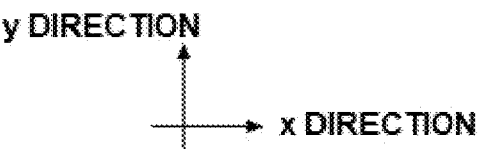

A creation method of this pseudo random regular disposition 1B includes: initially assuming zigzag arrangements R arranged at a pitch pa in the x direction as shown in FIG. 4B; then assuming a polygonal line F0 symmetric to the polygonal line forming the minimum repetition unit Ru of the zigzag arrangements R about y=x; moving the zigzag arrangements R arranged at the pitch pa along the polygonal line F0 in the y direction in order; and repeatedly performing the foregoing processes to obtain the conductive particle pattern shown in FIG. 4A.

In such a manner, a pseudo random regular disposition of conductive particles can be extremely easily formed by setting the pitch L1=the pitch L2=the intervals L3=the pitch pa, and making the number of conductive particles forming the minimum repetition unit Ru of the zigzag arrangements R and the number of arrangements in one cycle of the zigzag arrangements R in the x direction the same.

Figure 5A:
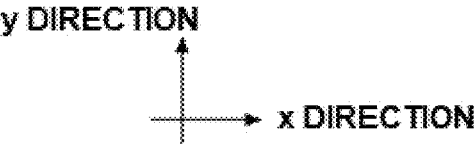
FIG. 5A shows a pseudo random regular disposition 1C of conductive particles included in an anisotropic conductive film according to the embodiment.

FIG. 5A shows a pseudo random regular disposition 1C, where the arrangements Rb and Rc include two conductive particles 2 each, the pitch L1=the pitch L2=the intervals L3=the pitch Pa, the amount of deviation Ld/the pitch pa=0.5, and the angle α=60°.

Figure 5B:
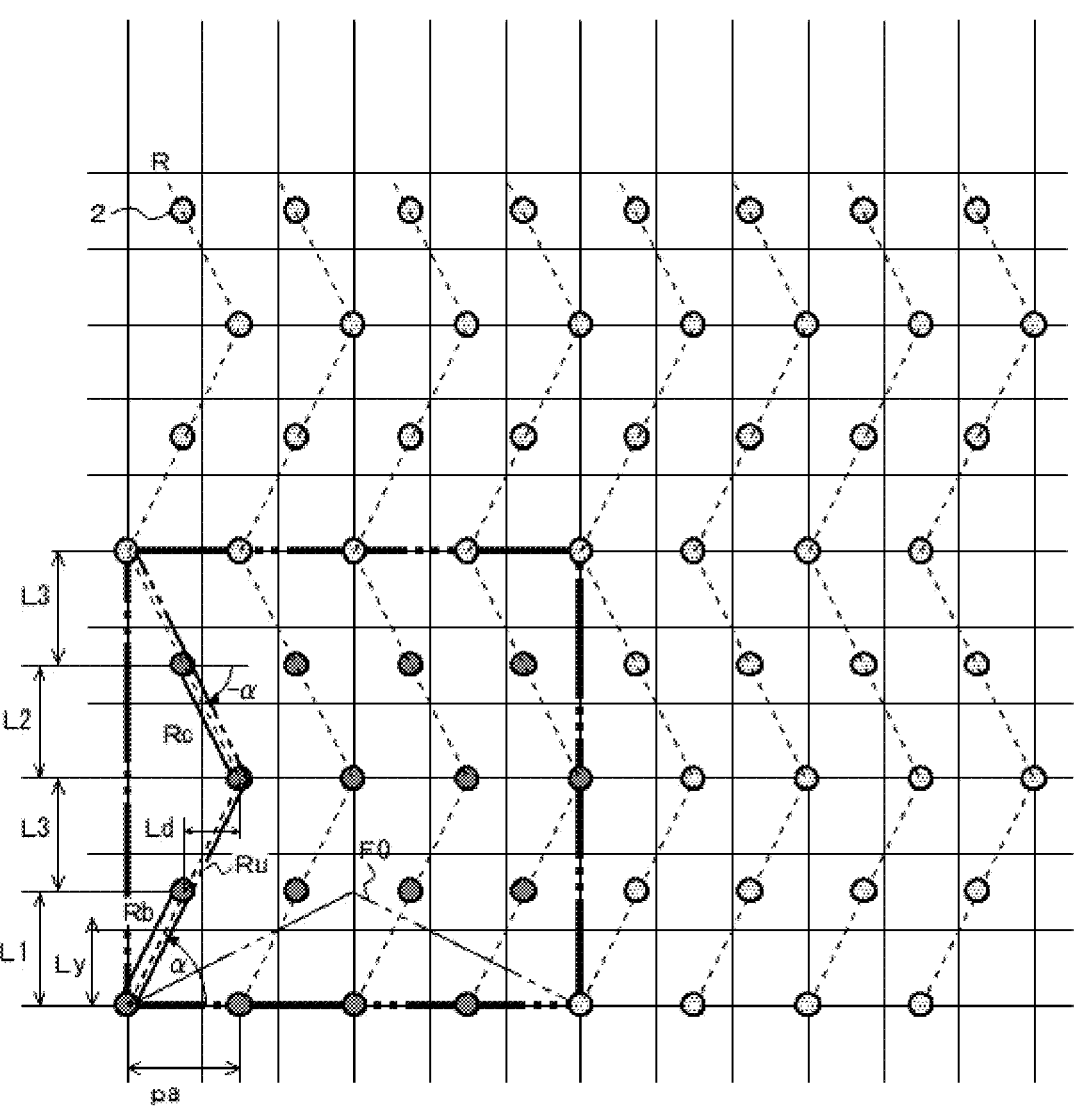
FIG. 5B is an explanatory diagram of a creation method of the pseudo random regular disposition 1C of conductive particles included in the anisotropic conductive film according to the embodiment.
Figure 5B:
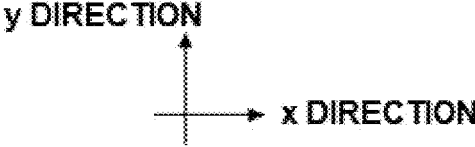

A creation method of this pseudo random regular disposition 1C also includes: initially assuming zigzag arrangements R arranged at a pitch pa in the x direction as shown in FIG. 5B; moving the zigzag arrangements R in the y direction in order while altering the positions of the zigzag arrangements R in the y direction along a polygonal line F0 symmetric to the polygonal line forming the minimum repetition unit Ru of the zigzag arrangements R about y=x; and repeatedly performing the foregoing processes.

The conductive particle pattern shown in FIG. 5B is such that first regions where arrangements Rb are arranged at a pitch pa in the x direction and second regions where arrangements Rc are arranged at a pitch pa in the x direction are alternately repeated in the y direction, and the extensions of the axes of the arrangements Rb in the first regions also serve as those of the arrangement axes in the second regions (in other words, the conductive particles in the second regions are located on the extensions of the arrangement axes of the first regions). By contrast, the pseudo random regular disposition according to the present embodiment shown in FIG. 5A is formed by arranging the zigzag arrangements R at a pitch pa in the x direction while altering the positions of the zigzag arrangements R in the y direction. In the present embodiment, the extensions of the arrangement axes of the first regions where the arrangements Rb are arranged at a pitch pa in the x direction do not serve as those of the second regions where the arrangements Rc are arranged at a pitch pa in the x direction.

Figure 6:
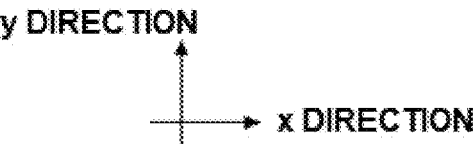
FIG. 6 shows a pseudo random regular disposition 1D of conductive particles included in an anisotropic conductive film according to the embodiment.

In the present invention, the polygonal line F0 serving as a reference in altering the positions of the zigzag arrangements R in the y direction is not limited to the one symmetric to the polygonal line forming the minimum repetition unit Ru of the zigzag arrangements R about y=x. For example, FIG. 6 shows a pseudo random regular disposition 1D, where the zigzag arrangements R shown in FIG. 5B, arranged at a pitch pa in the x direction are moved in the y direction while altering the positions of the zigzag arrangements R in the y direction along the polygonal line F0 which has the same shape as in FIG. 4A.

Figure 7:
FIG. 7 shows a pseudo random regular disposition 1E of conductive particles included in an anisotropic conductive film according to the embodiment.

FIG. 7 shows a pseudo random regular disposition 1E, where arrangements Rb1 and Rb2 or arrangements Rc1 and Rc2 repeated in the zigzag arrangements R have an amount of deviation Le in the x direction, in contrast to the pseudo random regular disposition 1B shown in FIG. 4A. With such arrangement, the amount of deviation between the closest conductive particles of adjoining arrangements Rb1 and Rc1 in the x direction is Ld, and the amount of deviation between the closest conductive particles of adjoining arrangements Rc1 and Rb2 in the x direction is zero.

Figure 8A:
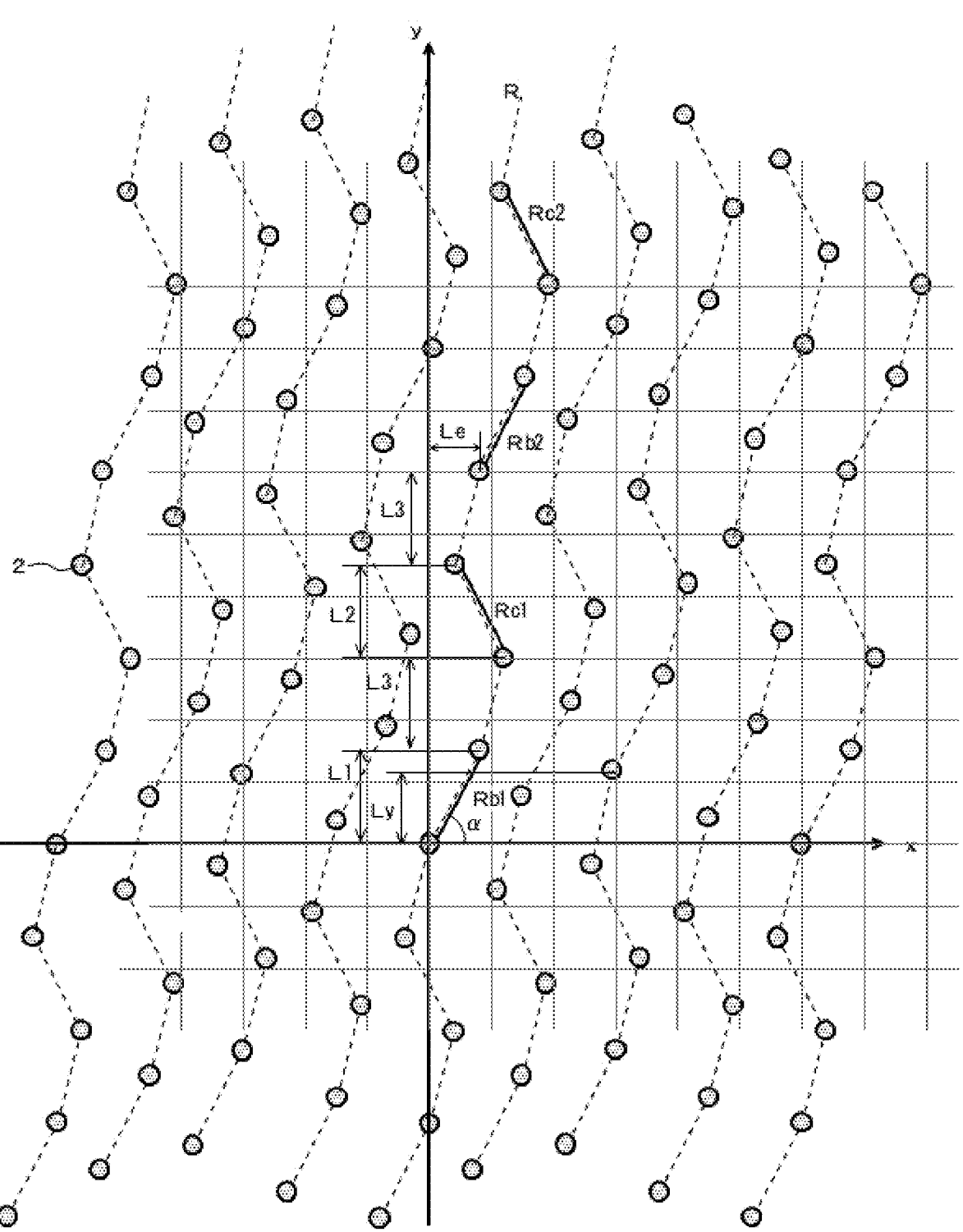
FIG. 8A shows a pseudo random regular disposition 1F of conductive particles included in an anisotropic conductive film according to the embodiment.

FIG. 8A shows a pseudo random regular disposition 1F, where the amount of deviation Le between the arrangements Rb1 and Rb2 in the x direction is increased as compared to the pseudo random regular disposition 1E shown in FIG. 7. Depending on the magnitude of the amount of deviation Le, the extending direction of the zigzag arrangements R can thus be tilted with respect to the y-axis.

Figure 8B:
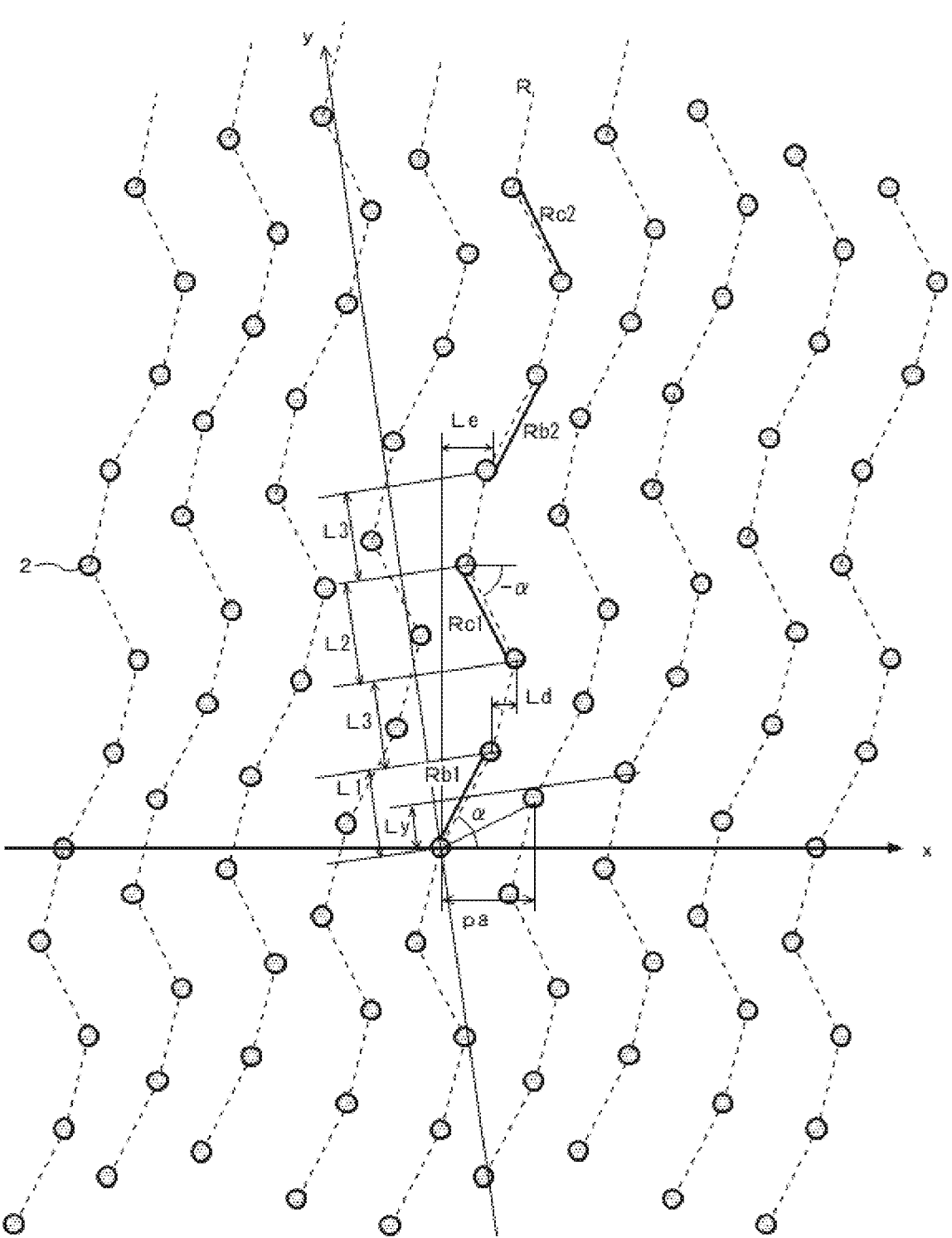
FIG. 8B shows the pseudo random regular disposition 1F of conductive particles included in the anisotropic conductive film according to the embodiment.

In the present invention, the xy coordinates are not limited to orthogonal coordinates. For example, FIG. 8B is a representation of the above-mentioned pseudo random regular disposition 1F shown in FIG. 8A using non-orthogonal coordinates where the x direction and the y direction are not orthogonal. For ease of design, it is desirable for orthogonal coordinates to be used.

<Number Density of Conductive Particles>

In the anisotropic conductive film according to the present invention, the number density of conductive particles can be determined on the basis of the shapes, sizes, and arrangement pitches of the terminals of the electronic parts to be connected by the anisotropic conductive film. The number density of conductive particles is usually not limited in particular, since preferable conditions vary depending on the combination and purposes of use of the electronic parts to be connected. The lower limit can practically be 30 particles/$mm^2$ or more, 150 particles/$mm^2$ or more, or 1000 particles/$mm^2$ or more. Lower number densities are expected to provide a cost reduction effect.

The upper limit thereof is practically preferably 500000 particles/$mm^2$ or less, 350000 particles/$mm^2$ or less, or 70000 particles/$mm^2$ or less, and more preferably 42000 particles/$mm^2$ or less. For fine-pitch applications, the number density may be 6000 to 35000 particles/$mm^2$, 120000 particles/$mm^2$ or more and not more than 350000 particles/$mm^2$, or 150000 particles/$mm^2$ or more and not more than 300000 particles/$mm^2$ in particular, depending on the fine pitch level. If the conductive particles have an average particle diameter of 10 μm or more, it is desirable for the range to be 50 to 2000 particles/$mm^2$.

The number density is preferably measured at a plurality (preferably five or more, and more preferably ten or more) of arbitrarily set rectangular regions with a side of 100 μm or greater, with a total area of the measurement regions of 2 $mm^2$ or more. The lengths of the sides and the total area of the rectangular regions can be adjusted on the basis of the average particle diameter. The size of each measurement region and the number of measurement regions can be adjusted as appropriate depending on the number density. For example, no less than several tens of conductive particles should be included in a rectangular region. As a more specific example, take an anisotropic conductive film for fine-pitch applications with a relatively high number density of conductive particles. In such case, the number density can be determined by measuring 200 regions with an area of 100 μm×100 μm (2 $mm^2$) using observation images of a metallurgical microscope, an electron microscope (such as a SEM and a TEM), or the like, and averaging the measurements. The number density may be measured using a three-dimensional surface measuring instrument. The number density may be determined by measuring observation images using image analysis software (such as WinROOF from MITANI Corporation and "A-Zo Kun" (registered trademark) from Asahi Kasei Engineering Corporation).

As for the number density of conductive particles, the area occupancy ratio of the conductive particles calculated by the following equation is preferably 0.3% or more in terms of a reduction in the conduction resistance. In view of reducing the thrust needed of pressing jigs for connection, the area occupancy ratio may be 40% or less, preferably 35% or less, and more preferably 30% or less:

Area occupancy ratio (%) of conductive particles=
[number density of conductive particles in plan view]×[average area of two conductive particles in plan view]×100.

<Position of Conductive Particles in Film Thickness Direction>

The conductive particles 2 are preferably aligned uniformly in the film thickness direction. For example, as shown in FIG. 2, the amounts of embedding Lb of the conductive particles 2 in the film thickness direction can be made uniform. This facilitates the stabilized capturability of the conductive particles 2 by the terminals. In the present invention, the conductive particles 2 may be exposed from the insulating resin layer 3 or fully embedded therein.

Here, the amount of embedding Lb refers to the distance between the tangent plane to the surface of the insulating resin layer 3, in which the conductive particles 2 are embedded (between the front and back of the insulating resin layer 3, the surface where the conductive particles 2 are exposed, or if the conductive particles 2 are fully embedded in the insulating resin layer 3, the surface closer to the conductive particles 2), at a midpoint between adjoining conductive particles and the deepest part of the conductive particles 2.

The amount of embedding Lb can be determined by observing a SEM image of a part of the film cross section of the anisotropic conductive film. In such a case, the amount of embedding Lb is preferably obtained by arbitrarily extracting 10 or more regions with an area of 30 mm² or more from the anisotropic conductive film, measuring the amounts of embedding of preferably a total of 50 or more conductive particles, more preferably 200 or more conductive particles, and averaging the measurements.

<Ratio of Embedding>

With the ratio of the amount of embedding Lb to the average particle diameter D of the conductive particles 2 as a ratio of embedding (Lb/D), the ratio of embedding is preferably 30% or more and not more than 105%. A ratio of embedding (Lb/D) of 30% or more enables the insulating resin layer 3 to maintain the conductive particles 2 at predetermined positions. A ratio of embedding (Lb/D) of 105% or less can reduce the amount of the resin of the insulating resin layer acting uselessly to make the conductive particles between the terminals flow during anisotropic conductive connection.

<Insulating Resin Layer>

Like the insulating resin layer of the anisotropic conductive film described in Japanese Patent No. 6187665, the insulating resin layer 3 in the anisotropic conductive film according to the present invention can be formed of a curable resin composition made of a polymerizable compound and a polymerization initiator. In such a case, the polymerization initiator may be a thermal polymerization initiator, a photopolymerization initiator, or a combination of these. For example, a cationic polymerization initiator is used as a thermal polymerization initiator, an epoxy resin is used as a thermally polymerizable compound, a photoradical polymerization initiator is used as a photopolymerization initiator, and an acrylate compound is used as a photopolymerizable compound. A thermal anionic polymerization initiator may be used as the thermal polymerization initiator. A microencapsulated latent curing agent formed by coating the surfaces of modified imidazole cores with polyurethane is preferably used as the thermal anionic polymerization initiator.

<Minimum Melt Viscosity of Insulating Resin Layer>

The minimum melt viscosity of the insulating resin layer 3 is not limited in particular, and can be 1000 Pas or more. The minimum melt viscosity can be similar to that of the insulating resin layer of the anisotropic conductive film described in Japanese Patent No. 6187665, and is preferably 1500 Pas or more, more preferably 2000 Pas or more, still more preferably 3000 to 15000 Pas, and particularly preferably 3000 to 10000 Pas. The minimum melt viscosity can be determined, for example, by using a rotary rheometer (from TA Instruments, Inc.) to maintain a constant measurement pressure of 5 g with an 8-mm-diameter measurement plate. More specifically, the minimum melt viscosity can be determined with a temperature range of 30° C. to 200° C., a rate of temperature increase of 10° C./min, a measurement frequency of 10 Hz, and a load variation of 5 g with respect to the above-mentioned measurement plate. Note that the minimum melt viscosity can be adjusted by changing the type and blending amount of small solid substances contained as a melt viscosity modifier, and the preparation conditions of the resin compound.

<Low-Viscosity Resin Layer>

The low-viscosity resin layer 4 is a resin layer which has a minimum melt viscosity lower than that of the insulating resin layer 3 in the range of 30° C. to 200° C. In the present invention, the low-viscosity resin layer 4 is provided according to necessity. With the low-viscosity resin layer 4 stacked on the insulating resin layer 3, the space formed by the electrodes and bumps of an electronic part in thermally pressure-bonding electronic parts opposed via the anisotropic conductive film 10A can be filled with the low-viscosity resin layer 4 to improve the adhesiveness between the electronic parts.

The greater the difference between the minimum melt viscosity of the insulating resin layer 3 and that of the low-viscosity resin layer 4, the more likely the space between the electronic parts connected via the anisotropic conductive film 10A is to be filled with the low-viscosity resin layer 4 and the adhesiveness between the electronic parts is to be improved. Moreover, the greater the difference, the smaller the amount of movement of the insulating resin layer 3 holding the conductive particles 2 during thermal pressure-bonding than that of the low-viscosity resin layer 4, and the more likely the capturability of the conductive particles 2 by the terminals is to be improved.

The minimum melt viscosity ratio of the insulating resin layer 3 to the low-viscosity resin layer 4 is preferably 2 or more, more preferably 5 or more, and still more preferably 8 or more, depending on the ratio of the layer thicknesses of the insulating resin layer 3 to the low-viscosity resin layer 4. In practical use, the minimum melt viscosity ratio is preferably 15 or less since too high a ratio can result in a resin protrusion or blocking if a long anisotropic conductive film is formed into a roll. More specifically, the minimum melt viscosity of the low-viscosity resin layer 4 preferably satisfies the above-mentioned minimum melt viscosity ratio with the insulating resin layer, and is preferably 3000 Pas or less, more preferably 2000 Pas or less, and still more preferably 100 to 2000 Pas.

The low-viscosity resin layer 4 can be formed by adjusting the viscosity of a resin composition similar to that for the insulating resin layer 3. The low-viscosity resin layer 4 may be formed of a different resin composition.

<Layer Thicknesses of Insulating Resin Layer and Low-Viscosity Resin Layer>

To ensure stable pushing of the conductive particles 2 into the insulating resin layer 3 in the process of producing the anisotropic conductive film to be described below, the insulating resin layer 3 preferably has a layer thickness of 0.3 times or more the average particle diameter D of the conductive particles 2, more preferably 0.6 times or more, still more preferably 0.8 times or more, and particularly preferably once or more. The upper limit of the layer thickness of the insulating resin layer 3 can be determined on the basis of the terminal shape, terminal thickness, an arrangement pitch, and the like of the electronic parts to be connected. Since too large a layer thickness uselessly makes the conductive particles 2 susceptible to resin flow during connection, the upper limit is preferably 20 times or less the average particle diameter D of the conductive particles 2, and more preferably 15 times or less.

In the present invention, the low-viscosity resin layer 4 is provided according to necessity. If the low-viscosity resin layer 4 is provided, the lower limit of the layer thickness thereof is preferably 0.2 times or more the average particle diameter D of the conductive particles 2, and more preferably once or more. Since too large a layer thickness makes the formation on the insulating resin layer 3 difficult, the upper limit of the layer thickness of the low-viscosity resin layer 4 is preferably 50 times or less the average particle diameter D of the conductive particles 2, more preferably 15 times or less, and still more preferably 8 times or less.

The total thickness of the insulating resin layer 3 and the low-viscosity resin layer 4 is preferably small in view of reducing useless flow of the conductive particles 2 in connecting the electronic parts, avoiding a resin protrusion or blocking in forming the anisotropic conductive film into a roll, and increasing the film length per unit weight of the anisotropic conductive film. However, too small a thickness leads to poor handleability of the anisotropic conductive film. Moreover, the anisotropic conductive film becomes difficult to be bonded to electronic parts. A pressure-sensitive adhesive force needed for temporary pressure-bonding in connecting the electronic parts might therefore be unavailable, and needed adhesion might not be obtained by actual pressure-bonding due to an insufficient amount of the resin. The total thickness is therefore preferably 0.6 times or more the average particle diameter D of the conductive particles 2, more preferably 0.8 times or more, still more preferably once or more, and particularly preferably 1.2 times or more.

The ratio of the thicknesses of the insulating resin layer 3 and the low-viscosity resin layer 4 can be adjusted as appropriate on the basis of the combination of electronic parts used for connection and the relationship of required performance and other factors. The layer thicknesses can be measured using a commercially available digital thickness gauge and the like. The digital thickness gauge preferably has a resolution of 0.1 μm or less.

Figure 3B:
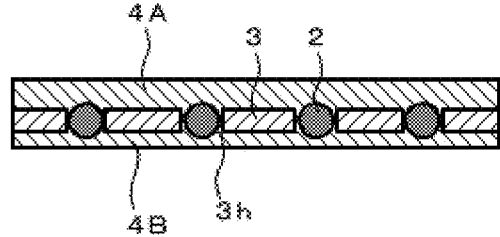
FIG. 3B is a cross-sectional view of an anisotropic conductive film 10C according to the embodiment.

If at least either the insulating resin layer or the low-viscosity resin layer is configured as a plurality of layers (for example, if the anisotropic conductive film has a three-layer configuration where the insulating resin layer 3 is sandwiched between low-viscosity resin layers 4A and 4B as shown in FIG. 3B), the total thickness of the low-viscosity resin layer(s) and the insulating resin layer(s) preferably satisfies the above-mentioned relationship.

<Roll of Anisotropic Conductive Film>

The anisotropic conductive film according to the present invention can be formed into a roll in its product form. The length of the roll is not limited in particular. In view of handleability of shipped products, the length is preferably 5000 m or less, more preferably 1000 m or less, and still more preferably 500 m or less. On the other hand, in terms of mass productivity, the length of the roll is preferably 5 m or more. The film width is not limited in particular, but preferably small in view of miniaturization of mounting bodies. Meanwhile, there is a certain demand for wide products since a large area is needed from the viewpoints of usages such as simultaneous anisotropic conductive connection of a plurality of parts and simultaneous anisotropic conductive connection over a considerably large size before cutting.

<Producing Method of Anisotropic Conductive Film>

The producing method of the anisotropic conductive film according to the present invention is not limited in particular. For example, the anisotropic conductive film is produced by fabricating a transfer mold for disposing conductive particles in a predetermined arrangement, filling recesses of the transfer mold with conductive particles, placing an insulating resin layer formed on a releasing film thereon, and pressing the same to push the conductive particles into the insulating resin layer, whereby the conductive particles are transferred to the insulating resin layer. A low-viscosity resin layer can further formed over the conductive particles or on the surface opposite the surface where the conductive particles are transferred.

The anisotropic conductive film may be produced by filling the recesses of the transfer mold with the conductive particles, then placing the insulating resin layer thereon, transferring the conductive particles from the transfer mold to the surface of the insulating resin layer without pushing the conductive particles into the insulating resin layer on the transfer mold, and pushing the conductive particles on the insulating resin layer into the insulating resin layer after the transfer.

As the transfer mold, one with convexes to the top surfaces of which a weak pressure-sensitive adhesive is applied so that the conductive particles adhere to the top surfaces may be used aside from the one with concaves to be filled with the conductive particles. Such transfer molds can be manufactured using conventional techniques such as machining, photolithography, and printing.

Instead of the method using a transfer mold, the conductive particles may be disposed in a predetermined arrangement by adopting a method for filling through holes provided in the predetermined arrangement with the conductive particles (method for filling through holes with the conductive particles and forming insulating resin films on both surfaces), a method for directly distributing the conductive particles over the film, a method for stretching a film where the conductive particles are closely disposed, etc.

<Connection Method of Electronic Parts Using Anisotropic Conductive Film>

As a method for connecting electronic parts using the anisotropic conductive film according to the present invention, for example, one of the electronic parts is placed on a stage, and the other is placed thereon via the anisotropic conductive film. The electronic parts are heated and pressed by a pressure-bonding tool to connect the terminals of the two electronic parts to each other by anisotropic conductive connection to produce a connection structure. In such a case, the electronic part placed on the stage is a second electronic part such as an IC chip, an IC module, an FPC, a glass substrate, a plastic substrate, a rigid substrate, and a ceramic substrate. The electronic part to be heated and pressed by the pressure-bonding tool is a first electronic part such as an FPC, a semiconductor element (IC chip, IC module, or LED element (mini LED, micro LED, etc.)), a sensor part, and a battery element. More specifically, the anisotropic conductive film is temporarily bonded to the second electronic part such as a various substrate, and temporarily pressure-bonded. The first electronic part such as an IC chip is set on the temporarily pressure-bonded anisotropic conductive film, and pressure-bonded for anisotropic conductive connection to produce the connection structure. Note that the connection structure can also be produced by temporarily bonding the anisotropic conductive film to the first electronic part instead of the second electronic part. Furthermore, the connection method is not limited to thermal pressure-bonding. Pressure-bonding using photocuring or pressure-bonding using both heat and light may be performed. The types of electronic parts have been increasing in recent years, and the pressure-bonding method is not limited to the aforementioned ones. The producing method of the connection structure is not limited to the aforementioned ones, either, since higher priority is given to selecting an optimum producing method for electronic parts.

The significance of the anisotropic conductive film according to the present invention is great if at least either one of the first and second electronic parts is formed of a material prone to thermal expansion, like an FPC and a plastic substrate. The effect of the anisotropic conductive film is particularly great if the terminal arrays have a fan-out pattern. The conductive particles are uniformly disposed for each terminal regardless of whether the terminal arrays to be connected include terminals of which the long-side direction is not inclined with respect to the arrangement direction of the terminals, whether the terminals to be connected vary in arrangement direction from one side to another of the parts like peripherally disposed terminals, or whether the terminals have rectangular shapes or circular shapes. This ensures reliable connection of the terminals, can prevent the occurrence of a short circuit, and facilitates indentation inspection. The anisotropic conductive film according to the present invention can therefore be used for general purposes regardless of the shape and disposition of the terminal arrays to be connected. The present invention encompasses a producing method of a connection structure where the terminals of a first electronic part and those of a second electronic part are connected by anisotropic conductive connection using the anisotropic conductive film according to the present invention, and the connection structure including a first electronic part and a second electronic part connected by anisotropic conductive connection using the anisotropic conductive film according to the present invention.

EXAMPLE

The present invention will now be specifically described in conjunction with an example thereof.

Example 1

A pseudo random regular disposition shown in FIG. 4A was simulated as a disposition of conductive particles in an anisotropic conductive film. Here, the diameter of the conductive particles 2 was 3 μm, L1=L2=L3=pa=8 μm, and the number density of the conductive particles 2 was 16000 particles/mm$^2$.

Figure 9:
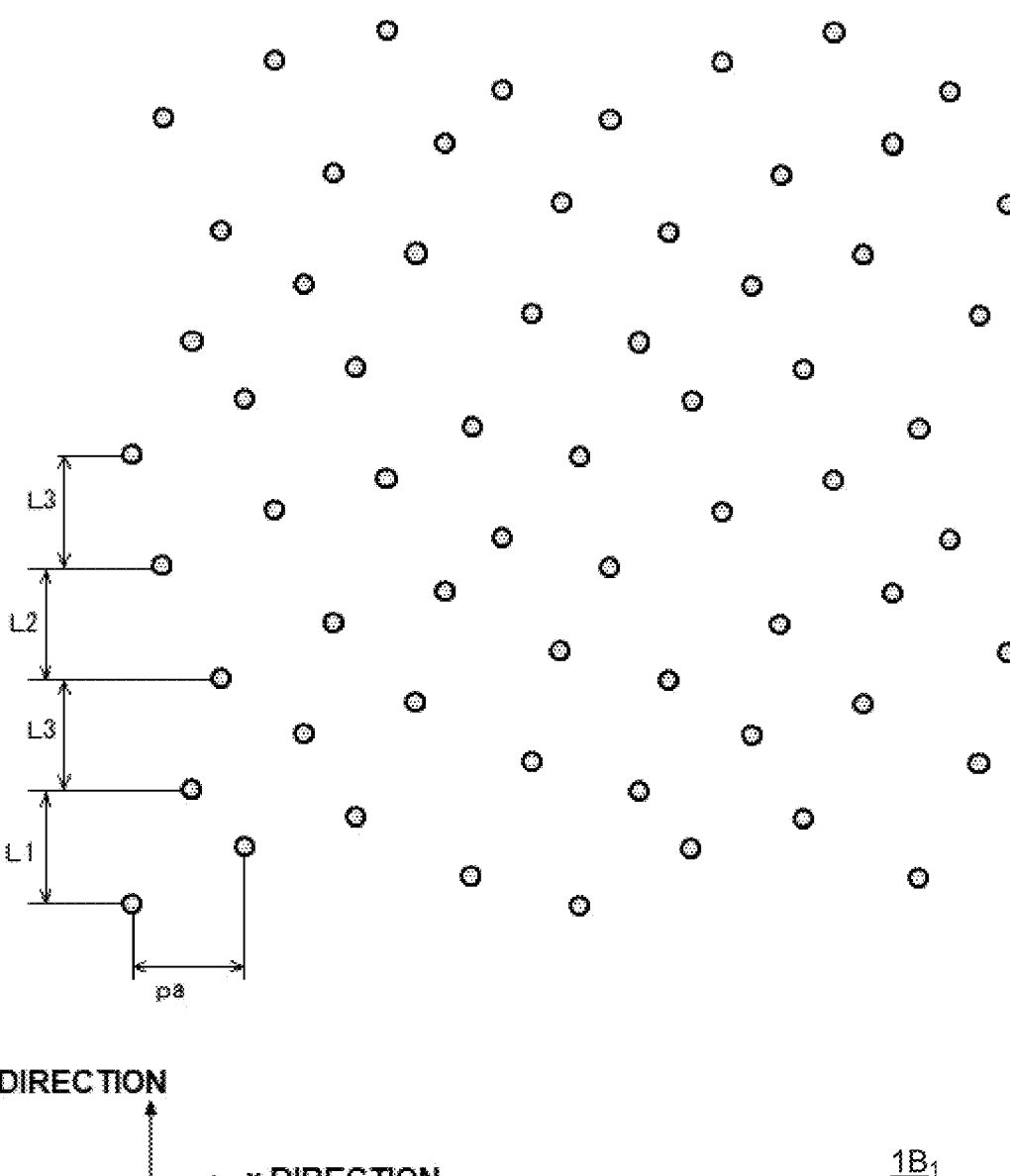
FIG. 9 shows a pattern $1B_1$ of conductive particles included in an anisotropic conductive film of an example.

FIG. 9 shows the resulting conductive particle pattern.

Comparative Example 1

A regular disposition shown in FIG. 4B was simulated as a disposition of conductive particles in an anisotropic conductive film. Here, the diameter of the conductive particles 2 was 3 μm, L1=L2=L3=pa=8 μm, and the number density of the conductive particles 2 was 16000 particles/mm$^2$.

Figure 10:
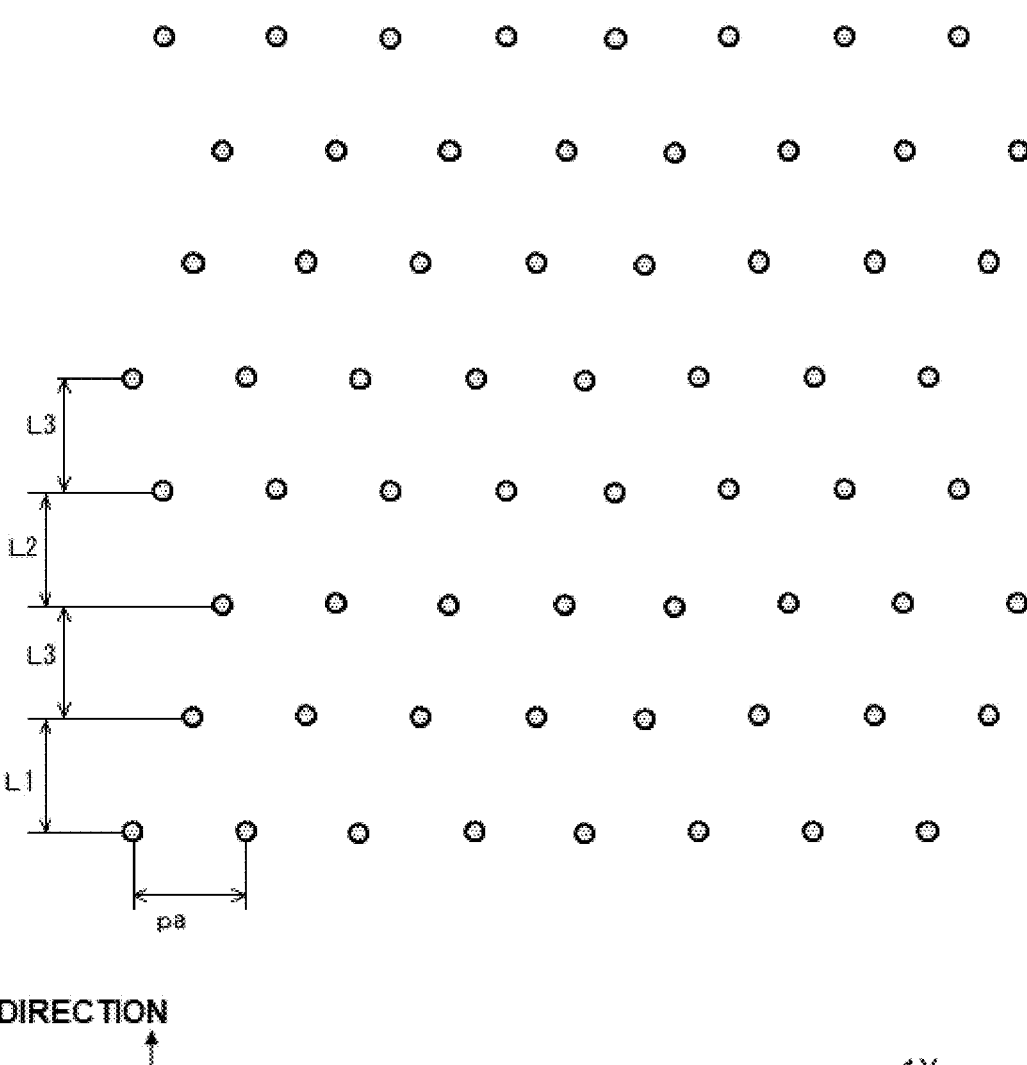
FIG. 10 shows a pattern 1X of conductive particles included in an anisotropic conductive film of a comparative example.
Figure 11A:
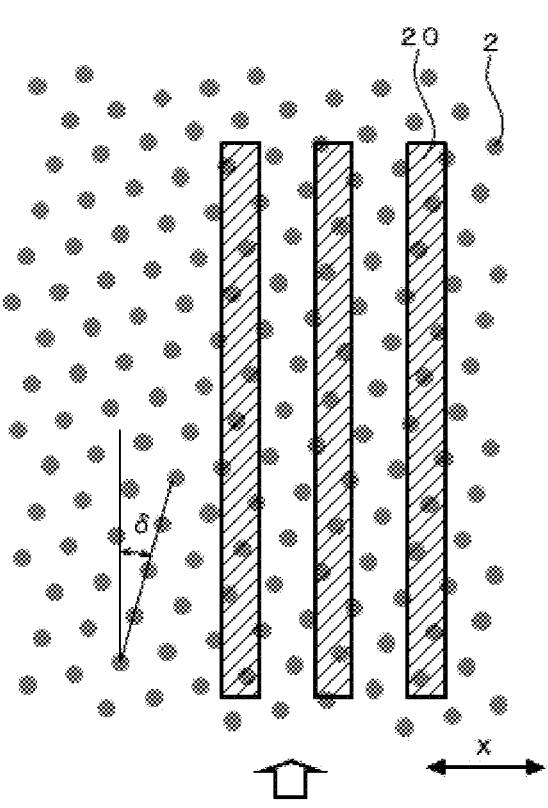
FIG. 11A is an explanatory diagram of a particle disposition where conductive particles are disposed in a hexagonal lattice.
Figure 11B:
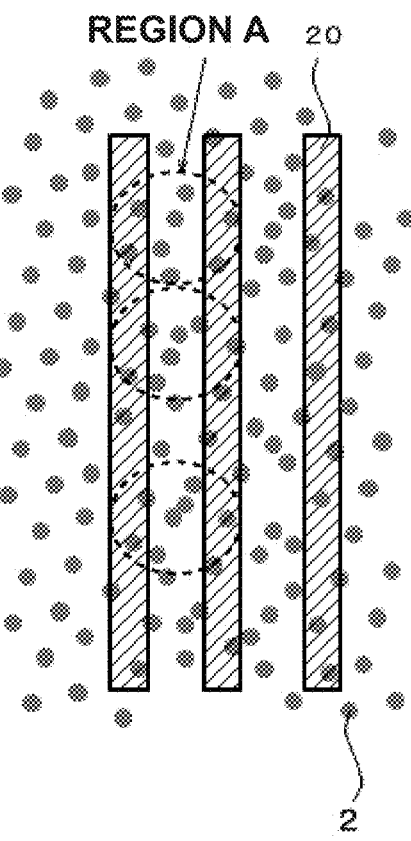
FIG. 11B is an explanatory diagram of a state after a terminal array is connected using an anisotropic conductive film where conductive particles are disposed in a hexagonal lattice.
Figure 12A:
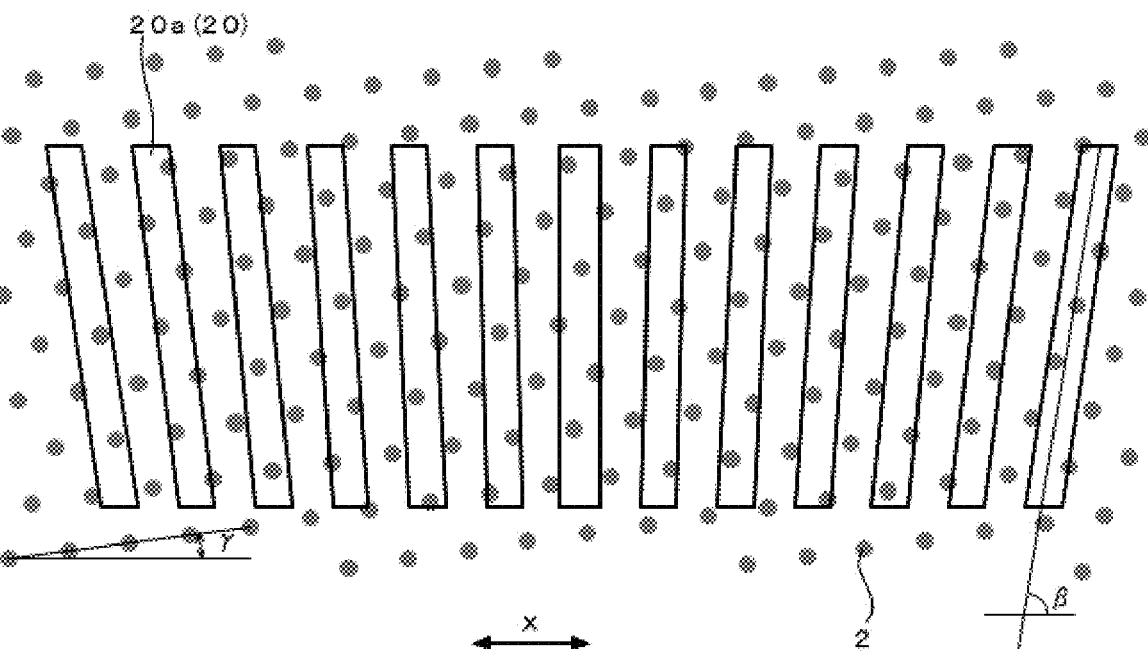
FIG. 12A is a plan view of a state where an anisotropic conductive film including conductive particles disposed in a hexagonal lattice (inclination angle γ) is stacked on a terminal array with a fan-out pattern.
Figure 12B:
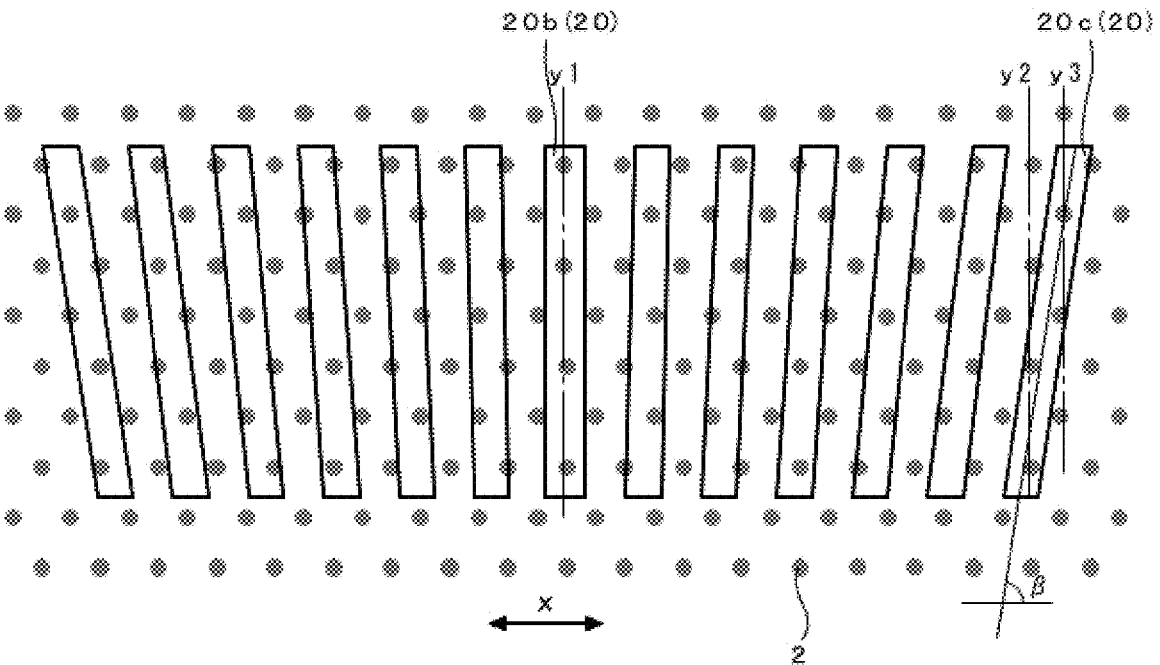
FIG. 12B is a plan view of a state where an anisotropic conductive film including conductive particles disposed in a hexagonal lattice (inclination angle γ=) 0° is stacked on a terminal array with a fan-out pattern.
Figure 12C:
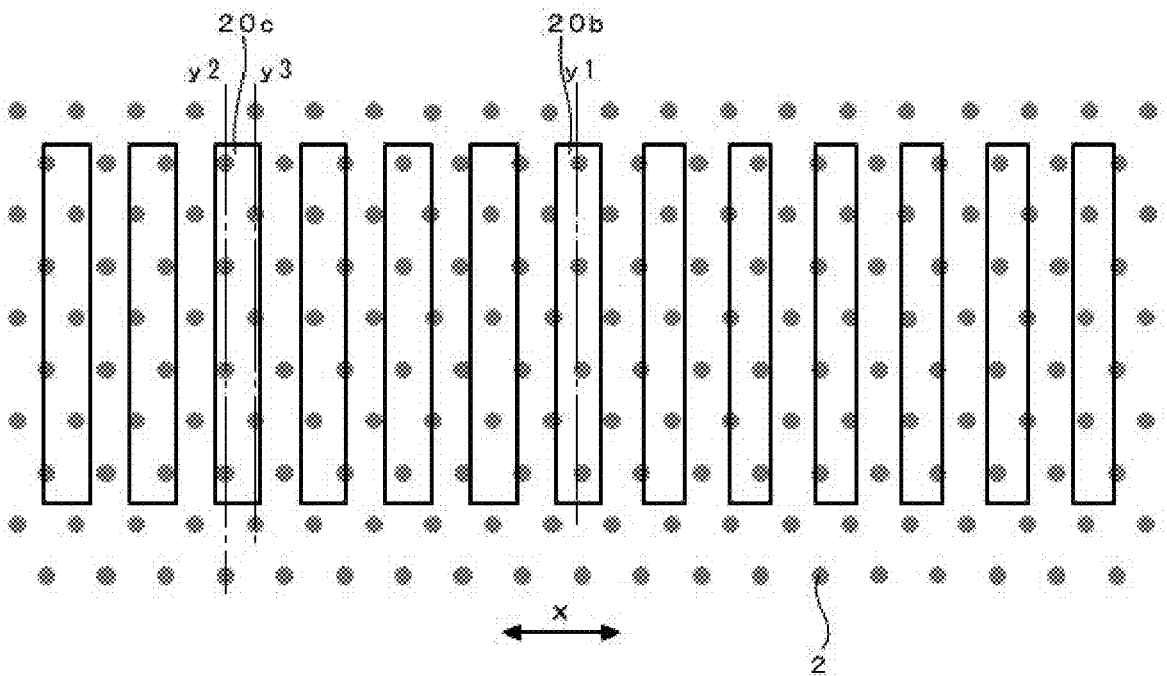
FIG. 12C is a plan view of a state where an anisotropic conductive film including conductive particles disposed in a hexagonal lattice (inclination angle γ=) 0° is stacked on a terminal array where the terminal axes of respective terminals are in the same direction.

FIG. 10 shows the resulting conductive particle pattern.

Comparative Example 2

A pattern of conductive particles disposed in a hexagonal lattice in an anisotropic conductive film was simulated, where the angle γ formed between a lattice axis and the x direction was 15° and the number density was 16000 particles/mm$^2$.

Comparative Example 3

A pattern of conductive particles disposed in a hexagonal lattice in an anisotropic conductive film was simulated, where the angle γ formed between a lattice axis and the x direction was 0° and the number density was 16000 particles/mm$^2$.

(Evaluation)

The anisotropic conductive films of example 1 and comparative examples 1 to 3 were examined by simulation for (i) the minimum number of conductive particles captured by each terminal and (ii) vertical and horizontal uniformity of the conductive particles captured by a terminal array in situations where the anisotropic conductive films were connected with terminal arrays of Cases 1 to 4 in Table 1.

In evaluating the pseudo randomness, (i) the minimum number of conductive particles captured and (ii) the vertical and horizontal uniformity of the conductive particles captured by the terminal array were evaluated on the basis of the following criteria:

(i) Minimum Number of Conductive Particles Captured

OK: four or more

NG: three or less (ii) Uniformity

Uniform: the distribution patterns of conductive particles captured by terminals located at vertically or horizontally symmetrical distances in the terminal array look the same.

Nonuniform: the distribution patterns of conductive particles captured by terminals located at vertically or horizontally symmetrical distances in the terminal array do not look the same.

Table 2 shows the results.

TABLE 1

| Case | 1 | 2 | 3 | 4 |
|---|---|---|---|---|
| Shape | Straight | Straight | Fan-out | Fan-out |
| Wiring Length (μm) | 100 | 4 | 100 | 4 |
| Wiring Width (μm) | 4 | 100 | 4 | 100 |
| Fan-out Angle (°) | 0 | 0 | −10 to 10 | −10 to 10 |
| Inter-trace Spacing (μm) | 20 | 20 | 20 | 20 |

TABLE 2

| Particle Disposition | | Example 1 FIG. 4A | | Comparative Example 1 FIG. 4B | | Comparative Example 2 Hexagonal (γ = 15°) *1 | | Comparative Example 3 Hexagonal (γ = 0°) *2 | |
|---|---|---|---|---|---|---|---|---|---|
| Minimum | Case 1 | 6 | OK | 6 | OK | 5 | OK | 0 | NG |
| Number Of | Case 2 | 6 | OK | 0 | NG | 5 | OK | 0 | NG |
| Particles | Case 3 | 4 | OK | 4 | OK | 4 | OK | 0 | NG |
| Captured | Case 4 | 4 | OK | 0 | NG | 4 | OK | 0 | NG |
| Uniformity | Case 1 | Horizontally Uniform | OK | Horizontally Uniform | OK | Horizontally Uniform | OK | Horizontally Uniform | OK |
| | Case 2 | Vertically Uniform | OK | Vertically Uniform | OK | Vertically Uniform | OK | Vertically Uniform | OK |
| | Case 3 | Horizontally Uniform | OK | Horizontally Uniform | OK | Horizontally Nonuniform | NG | Horizontally Uniform | OK |
| | Case 4 | Vertically Uniform | OK | Vertically Uniform | OK | Vertically Nonuniform | NG | Vertically Uniform | OK |

Figure 13A:
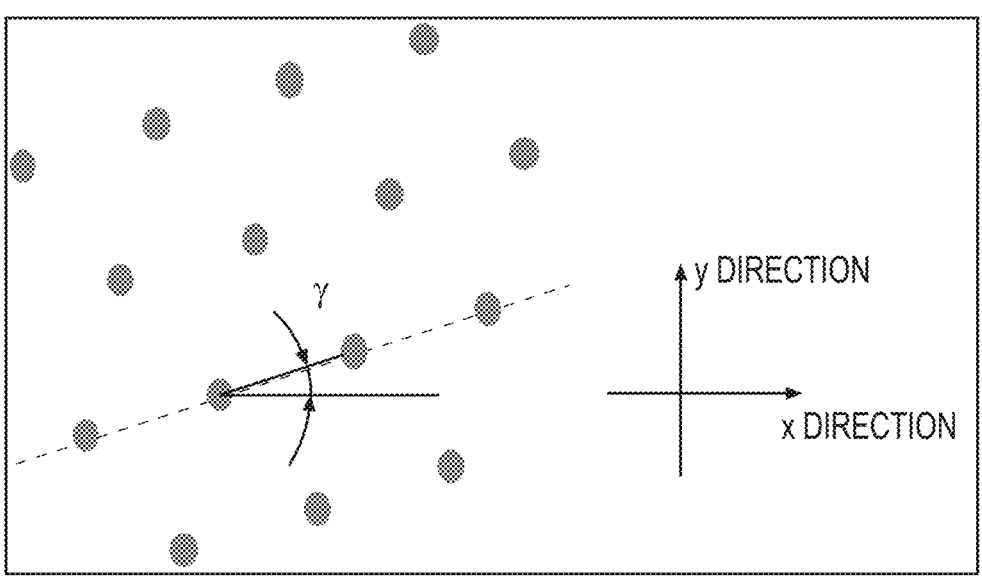
FIG. 13A represents a pattern of conductive particles disposed in a hexagonal lattice in the anisotropic conductive film of Comparative Example 2.
Figure 13B:
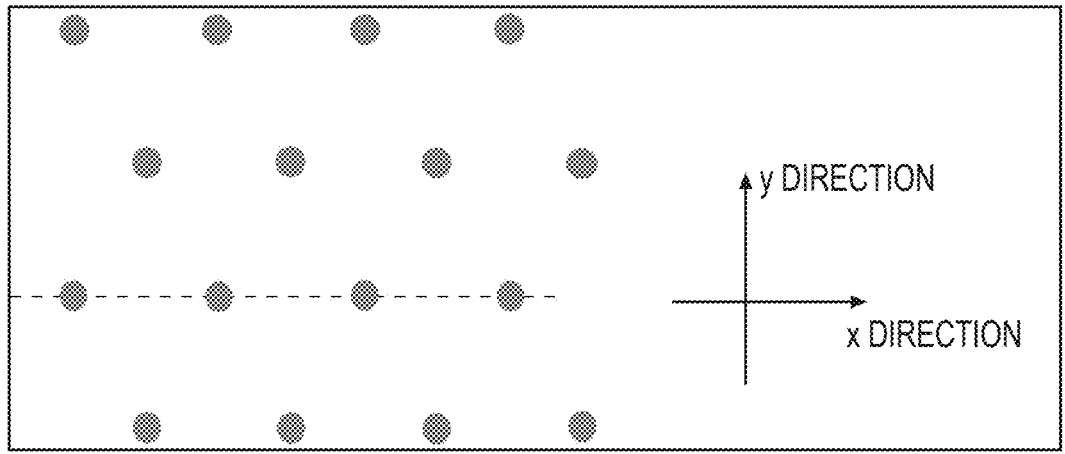
FIG. 13B represents a pattern of conductive particles disposed in a hexagonal lattice in the anisotropic conductive film of Comparative Example 3.

*1 in Table 2 refers to FIG. 13A;
*2 in Table 2 refers to FIG. 13B.

From Table 2, it was confirmed that the anisotropic conductive film of the example can provide capturability even with terminals in 90° different directions, and particles are vertically and horizontally uniformly captured by fan-out terminals.

A comparison between FIGS. 9 and 10 shows that the pattern of the example provides superior apparent irregularity.

REFERENCE SIGNS LIST

1A, 1B, 1C, 1D, 1E, 1F, 1B$_1$ pseudo random regular disposition
2 conductive particle
3 insulating resin layer, insulating film
3$h$ through hole
4, 4A, 4B low-viscosity resin layer
10A, 10B, 10C anisotropic conductive film
20 terminal
F polygonal line
F0 polygonal line symmetric to polygonal line forming minimum repetition unit Ru of zigzag arrangements R about y=x
pa pitch of zigzag arrangements R in x direction when zigzag arrangements R are located at constant positions in y direction
R zigzag arrangement
Rb, Rc arrangement
Ru minimum repetition unit of zigzag arrangements R
U minimum repetition unit of pseudo random regular disposition
α angle formed between arrangement Rb and x direction

The invention claimed is:

1. An anisotropic conductive film comprising conductive particles disposed in an insulating resin layer, wherein
zigzag arrangements R of the conductive particles are arranged at a predetermined pitch in an x direction on an xy plane in a plan view of the anisotropic conductive film while periodically shifting positions in a y direction, the zigzag arrangements R each including an arrangement Rb and an arrangement Rc repeatedly provided at predetermined intervals in the y direction, the arrangement Rb includes the conductive particles arranged at a positive inclination, and the arrangement Rc includes the conductive particles arranged at a negative inclination, wherein the conductive particles are not arranged in a regular hexagonal lattice pattern, and a pitch pa of the zigzag arrangements R in the x direction is constant when the zigzag arrangements R arranged in the x direction are located at constant positions in the y direction.

2. The anisotropic conductive film according to claim 1, wherein the arrangement Rc is arranged in a direction reverse to an arrangement direction of the arrangement Rb with respect to the x direction.

3. The anisotropic conductive film according to claim 1, wherein an interval L3 between the arrangement Rb and the arrangement Rc in the y direction is constant.

4. The anisotropic conductive film according to claim 1, wherein the pitch pa, a pitch L1 of the conductive particles in the arrangement Rb in the y direction, a pitch L2 of the conductive particles in the arrangement Rc in the y direction, and an interval L3 between the arrangement Rb and the arrangement Rc in the y direction are the same.

5. The anisotropic conductive film according to claim 1, wherein an amplitude Ly of positions of the zigzag arrangements R in the y direction is less than an interval L3 between the arrangement Rb and the arrangement Rc in the y direction.

6. The anisotropic conductive film according to claim 1, wherein an amplitude Lx in the x direction of the zigzag arrangements R is smaller than the pitch pa.

7. The anisotropic conductive film according to claim 1, wherein a pitch L1 of the conductive particles in the arrangement Rb in the y direction, a pitch L2 of the conductive particles in the arrangement Rc in the y direction, and an interval L3 between the arrangement Rb and the arrangement Rc in the y direction are the same.

8. A producing method of a connection structure, comprising connecting a terminal of a first electronic part and a terminal of a second electronic part by anisotropic conductive connection using the anisotropic conductive film according to claim 1.

9. A connection structure comprising a first electronic part and a second electronic part connected by anisotropic conductive connection via the anisotropic conductive film according to claim 1.

10. An anisotropic conductive film comprising conductive particles disposed in an insulating resin layer, wherein
zigzag arrangements R of the conductive particles are arranged at a predetermined pitch in an x direction on an xy plane in a plan view of the anisotropic conductive film while periodically shifting positions in a y direction, the zigzag arrangements R each including an arrangement Rb and an arrangement Rc repeatedly provided at predetermined intervals in the y direction, the arrangement Rb includes the conductive particles arranged at a positive inclination, and the arrangement Rc includes the conductive particles arranged at a negative inclination, wherein the conductive particles are not arranged in a regular hexagonal lattice pattern, and an interval L3 between the arrangement Rb and the arrangement Rc in the y direction is constant.

11. The anisotropic conductive film according to claim 10, wherein the arrangement Rc is arranged in a direction reverse to an arrangement direction of the arrangement Rb with respect to the x direction.

12. The anisotropic conductive film according to claim 10, wherein a pitch L1 of the conductive particles in the arrangement Rb in the y direction, a pitch L2 of the conductive particles in the arrangement Rc in the y direction, and the interval L3 are the same.

13. The anisotropic conductive film according to claim 10, wherein a pitch pa of the zigzag arrangements R in the x direction, a pitch L1 of the conductive particles in the arrangement Rb in the y direction, a pitch L2 of the conductive particles in the arrangement Rc in the y direction, and the interval L3 are the same.

14. The anisotropic conductive film according to claim 10, wherein an amplitude Ly of positions of the zigzag arrangements R in the y direction is less than an interval L3 between the arrangement Rb and the arrangement Rc in the y direction.

15. An anisotropic conductive film comprising conductive particles disposed in an insulating resin layer, wherein zigzag arrangements R of the conductive particles are arranged at a predetermined pitch in an x direction on an xy plane in a plan view of the anisotropic conductive film while periodically shifting positions in a y direction, the zigzag arrangements R each including an arrangement Rb and an arrangement Rc repeatedly provided at predetermined intervals in the y direction, the arrangement Rb includes the conductive particles arranged at a positive inclination, and the arrangement Rc includes the conductive particles arranged at a negative inclination, wherein the conductive particles are not arranged in a regular hexagonal lattice pattern, and a number of the conductive particles constituting a minimum repetition unit in the zigzag arrangements R and a number of arrangements of the zigzag arrangements in the x direction corresponding to one cycle of shifting of positions of the zigzag arrangements R in the y direction are the same.

16. The anisotropic conductive film according to claim 15, wherein the arrangement Rc is arranged in a direction reverse to an arrangement direction of the arrangement Rb with respect to the x direction.

17. The anisotropic conductive film according to claim 15, wherein an interval L3 between the arrangement Rb and the arrangement Rc in the y direction is constant.

18. The anisotropic conductive film according to claim 15, wherein a pitch L1 of the conductive particles in the arrangement Rb in the y direction, a pitch L2 of the conductive particles in the arrangement Rc in the y direction, and an interval L3 between the arrangement Rb and the arrangement Rc in the y direction are the same.

19. The anisotropic conductive film according to claim 15, wherein the pitch pa, a pitch L1 of the conductive particles in the arrangement Rb in the y direction, a pitch L2 of the conductive particles in the arrangement Rc in the y direction, and an interval L3 between the arrangement Rb and the arrangement Rc in the y direction are the same.

20. The anisotropic conductive film according to claim 15, wherein an amplitude Ly of positions of the zigzag arrangements R in the y direction is less than an interval L3 between the arrangement Rb and the arrangement Rc in the y direction.

21. An anisotropic conductive film comprising conductive particles disposed in an insulating resin layer, wherein zigzag arrangements R of the conductive particles are arranged at a predetermined pitch in an x direction on an xy plane in a plan view of the anisotropic conductive film while periodically shifting positions in a y direction, the zigzag arrangements R each including an arrangement Rb and an arrangement Rc repeatedly provided at predetermined intervals in the y direction, the arrangement Rb includes the conductive particles arranged at a positive inclination, and the arrangement Rc includes the conductive particles arranged at a negative inclination, wherein the conductive particles are not arranged in a regular hexagonal lattice pattern, and an arrangement of the conductive particles which constitute a minimum repetition unit in the zigzag arrangements R and which are arranged in the x direction with positions thereof in the y direction being shifted for one cycle is symmetric about y=x.

22. The anisotropic conductive film according to claim 21, wherein the arrangement Rc is arranged in a direction reverse to an arrangement direction of the arrangement Rb with respect to the x direction.

23. The anisotropic conductive film according to claim 21, wherein an interval L3 between the arrangement Rb and the arrangement Rc in the y direction is constant.

24. The anisotropic conductive film according to claim 21, wherein a pitch L1 of the conductive particles in the arrangement Rb in the y direction, a pitch L2 of the conductive particles in the arrangement Rc in the y direction, and an interval L3 between the arrangement Rb and the arrangement Rc in the y direction are the same.

25. The anisotropic conductive film according to claim 21, wherein the pitch pa, a pitch L1 of the conductive particles in the arrangement Rb in the y direction, a pitch L2 of the conductive particles in the arrangement Rc in the y direction, and an interval L3 between the arrangement Rb and the arrangement Rc in the y direction are the same.

26. The anisotropic conductive film according to claim 21, wherein an amplitude Ly of positions of the zigzag arrangements R in the y direction is less than an interval L3 between the arrangement Rb and the arrangement Rc in the y direction.

* * * * *